(12) United States Patent
Nakajima

(10) Patent No.: US 7,216,058 B2
(45) Date of Patent: May 8, 2007

(54) DIAGNOSTIC METHOD FOR ANALYZING POWER CONSUMPTION OF ELECTRICAL EQUIPMENT

(75) Inventor: Takahide Nakajima, Kanagawa (JP)

(73) Assignee: CIMX Corporation (JP)

( * ) Notice: Subject to any disclaimer, the term of this patent is extended or adjusted under 35 U.S.C. 154(b) by 0 days.

(21) Appl. No.: 11/104,244

(22) Filed: Apr. 11, 2005

(65) Prior Publication Data

US 2006/0229847 A1    Oct. 12, 2006

(51) Int. Cl.
*G06F 11/30* (2006.01)

(52) U.S. Cl. .................. 702/183; 700/108; 702/57

(58) Field of Classification Search .............. 702/57, 702/60–61, 115, 182, 183; 700/108, 159
See application file for complete search history.

(56) References Cited

U.S. PATENT DOCUMENTS 6,633,823 B2 * 10/2003 Bartone et al. ............... 702/57
6,993,403 B1 * 1/2006 Dadebo et al. ............. 700/108
2003/0204371 A1 * 10/2003 Sciamanna ................. 702/183

* cited by examiner

*Primary Examiner*—John Barlow
*Assistant Examiner*—John Le
(74) *Attorney, Agent, or Firm*—Anderson Kill & Olick, PC

(57) ABSTRACT

A method for permitting an on-site diagnosis of the performance and/or production activity of one or more unit(s) of electrical equipment in a facility to determine if power is being wasted, comprising the steps of measuring the electricity consumptions of the unit(s); displaying time with a fixed relationship along two different coordinates of two separate, intersecting axes; dividing the time displayed into time segments corresponding to the operation times of the unit(s) over first and second time intervals for the respective coordinates, where the first time interval's time segments correspond to one or a small number of the second time interval's; and displaying the unit(s)' measured electricity consumptions, for each time segment, at each intersection of the two time coordinates such that an on-site determination of the operating condition of the electrical equipment unit(s) becomes visually apparent from the display.

14 Claims, 4 Drawing Sheets

FIG. 2A

DIAGNOSTIC METHOD FOR ANALYZING POWER CONSUMPTION OF ELECTRICAL EQUIPMENT

FIELD OF THE INVENTION

The present invention relates to a diagnostic method for analyzing power consumption of electrical equipment and more particularly to a method for providing on-site diagnosis of the performance and production activity of electrical equipment in a facility such as a factory, shop or building to determine if power is being wasted.

BACKGROUND OF THE INVENTION

At present no method exists for making an on site diagnosis of the performance and production activity of electrical equipment in a facility or for determining if the equipment individually and/or in concert is consuming power wastefully. The power consumption in a factory, plant, building etc. is currently measured on an overall basis for the entire plant or for a specific installation or unit of equipment in the facility. This is done primarily to determine the cost of electricity in the operation of the facility and/or the cost of electricity to run individual units of electrical equipment in the facility and to analyze overall cost. This is also useful for determining the overall efficiency of the facility or of a given unit of electrical equipment. A technique currently used in the measurement of power consumption is to identify and analyze periods of peak power consumption either for the entire facility or for one or more selected units of electrical equipment either individually or in combination. By measuring peak power consumption an analysis can be made as to when to reduce power for the purpose of conservation of energy or simply to limit usage. The ultimate goal of a peak power consumption analysis is the reduction of power consumption. However, at present, the reduction in the consumption of power is realized at the expense of production either directly or indirectly. In this context the usual focus of such an analysis is directed to electrical equipment such as air conditioner's since they relate to production only indirectly. This sometimes leads to a situation where, based upon a peak power consumption analysis, the air conditioning may be suddenly stopped, particularly in the hot summer seasons, to minimize and conserve energy cost independent of its effect on production. Stated otherwise, any reduction in power consumption is currently accomplished at the expense of production and/or based upon the replacement of equipment with a lower energy efficiency rating with newer equipment having a higher energy efficiency rating The conventional method for measuring power consumption does not provide data for making an on site analysis of the production activity of one or more units(s) of electrical equipment in a facility, plant or shop and/or to determine if the equipment individually and/or in concert is consuming power wastefully. Conventional techniques are limited to measuring power consumption relative to time on a one-dimensional time axis display of power consumed (usually in kwh) relative to time. The relationship between production activity and power consumption cannot be ascertained directly from this measurement. Accordingly, since no direct relationship currently exists between production activity and power consumption an assessment between power consumption and operating cycle cannot be easily made and a time management analysis of the factory, plant, shop etc based upon production activity and power consumption is complicated. Furthermore, a precise estimation of an anticipated reduction in power consumption cannot be made using conventional techniques. This leads to management difficulty in estimating the amount of capital investment for equipment replacement and/or for human resources.

SUMMARY OF THE INVENTION

A method has been discovered in accordance with the present invention permitting an on-site diagnosis of the production activity of one or more units of electrical equipment in a facility such as a factory, shop, plant or building to determine if power is being wasted. The method of the present invention comprises the steps of: measuring the consumption of electricity in one or more unit(s) of electrical equipment; displaying time along two different coordinates corresponding to two separate axes which intersect one another for forming a time grid with the time displayed along one of the coordinates being interrelated to the time displayed along the other coordinate in a fixed relationship; dividing the time displayed along each coordinate into a multiple number of time segments corresponding to the operation time of the one or more unit(s) of electrical equipment over a first time interval for one of coordinates and over a second time interval for the other coordinate with the time segments in the first time interval corresponding to only one or a small number of time segments in the second time interval and displaying the measured consumption of electricity for the one or more unit(s) of electrical equipment at a location for each time segment in the first and second time interval at each intersection of the two time coordinates such that an on-site determination of the operating condition of said one or more unit(s) of electrical equipment becomes visually apparent from the display.

The method of the present invention also enables a determination to be readily made as to whether power is being wasted and in which facility. It is preferred for one coordinate to define a fixed time period of machine operation such as one hour which is divided into time segments such as minutes and for the other coordinate to define a multiple of the fixed time period of machine operation such as one day of machine operation. This time period is also divided into segments with each segment representing a multiple of the divided time segments in the other coordinate. It is further preferred to use different colors to designate the different modes of machine operation. Alternatively, differences in shades of gray can be used to enhance the visual effect.

Other objects and advantages of the present invention will become apparent when read in conjunction with the drawings and detailed description of the invention as follows:

BRIEF DESCRIPTION OF THE DRAWINGS

FIGS. 2A and 2B in combination show a preferred embodiment of the invention for one or more units of electrical equipment in a given facility using different shades of gray to accentuate the readings for an on-site visual analysis;

FIG. 6 is an example of the display of FIGS. 2A and 2B showing contrast by means of gray shading for the different levels of power consumption instead of color contrast; and FIG. 7 is yet a further display in which the numbers inserted in the intersecting boxes in FIGS. 2A and 2B are digital numbers.

DETAILED DESCRIPTION

Figure 1A:
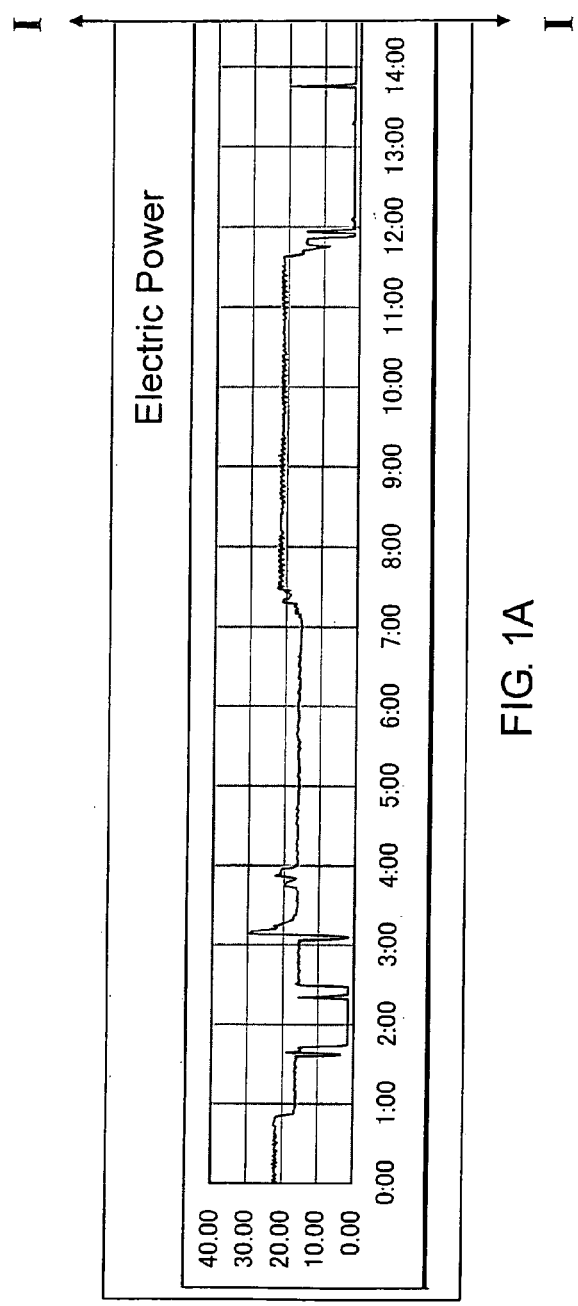
FIGS. 1A and 1B in combination constitute a typical one dimensional time axis display of the power consumption of an electrical device relative to time.
Figure 1B:
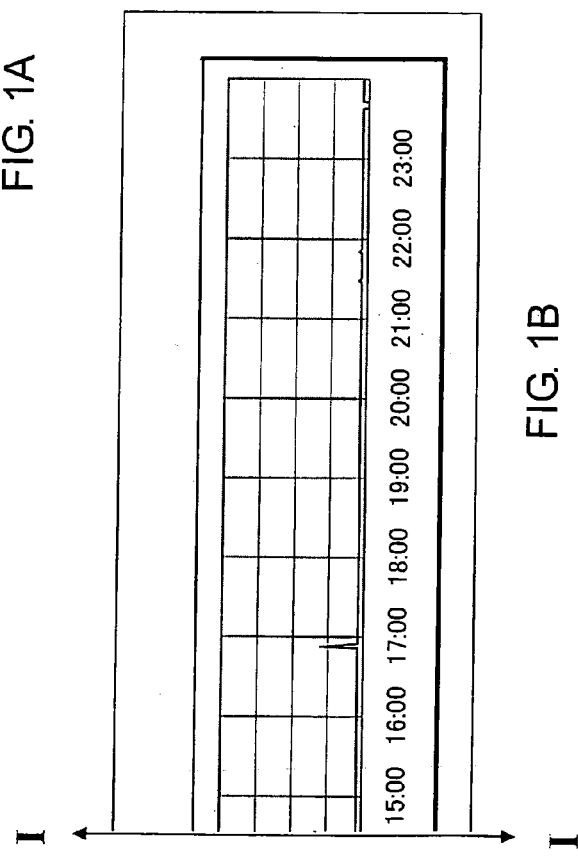

The display as shown in FIGS. 1A and 1B is a typical two dimensional graph showing a one dimensional display of time relative to consumed power for one or more unit(s) of electrical equipment in a given facility represented by a shop, building, factory or plant. FIGS. 1A and 1B do not indicate the existence of the relationship, if any, between production activity of the units(s) of electrical equipment in the facility and power consumption. Accordingly, from this display, it is not possible to determine if and whether the units of equipment in the facility taken individually and/or in concert are consuming power wastefully.

Figure 2A:
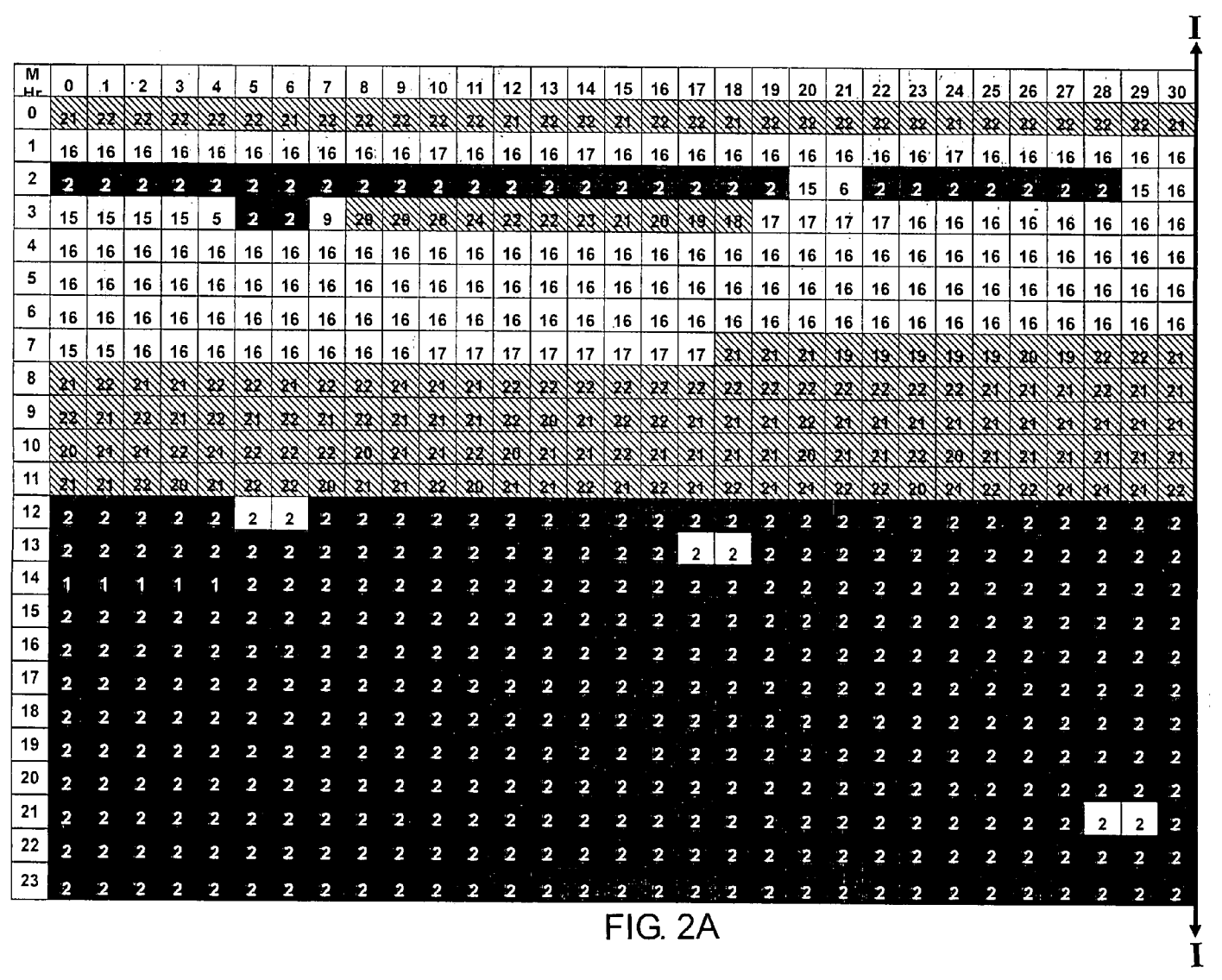
Figure 2B:
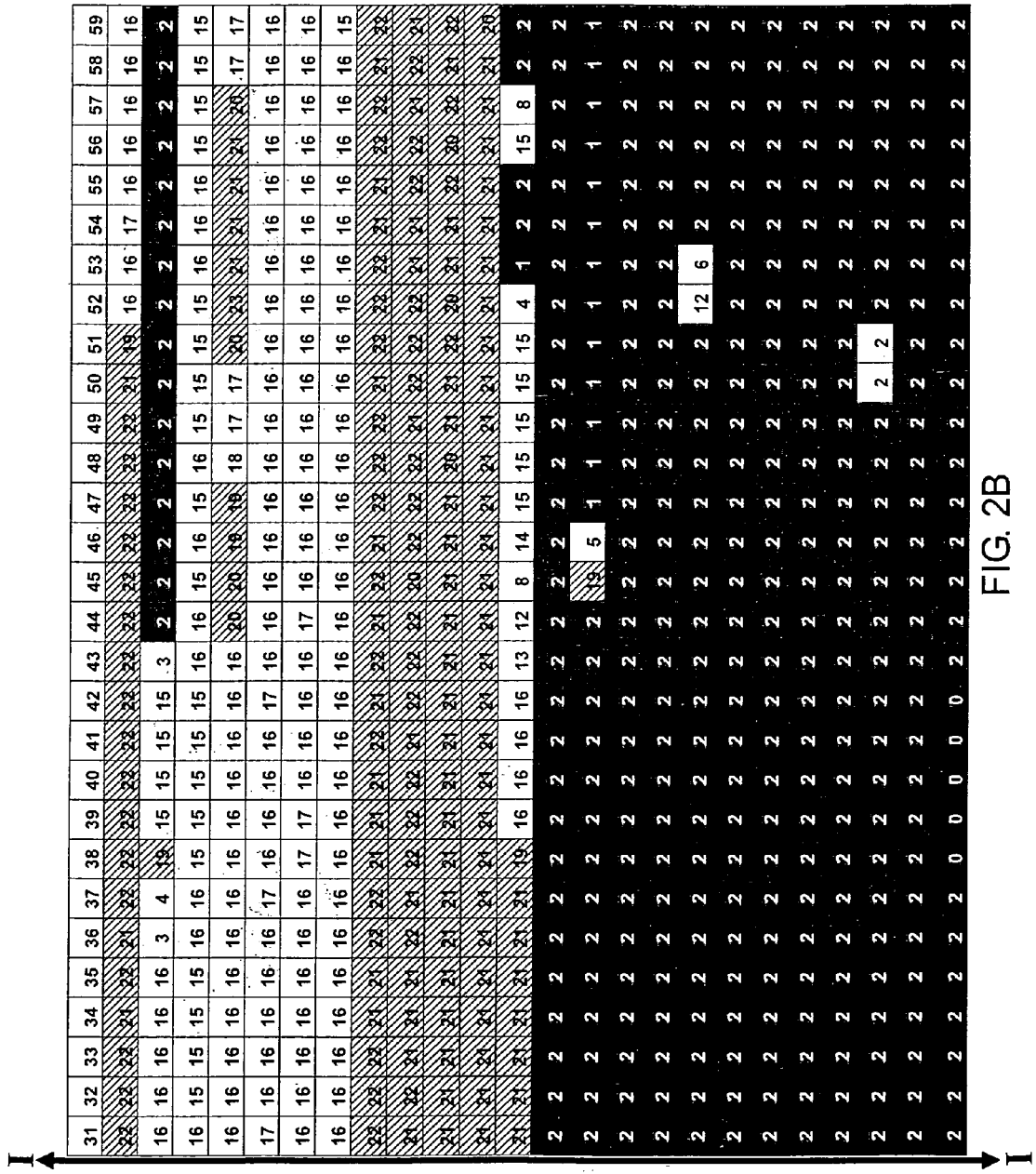

The method of the present invention is depicted in FIGS. 2A and 2B and involves displaying time along two different coordinates corresponding to two separate axes which intersect one another for forming a time grid. The time displayed along one of the coordinates is interrelated to the time displayed along the other coordinate in a fixed relationship of minutes to hours, days to weeks or months etc. between production time over a first time period relative to production time over a second time period.

The time displayed along each coordinate is divided into a multiple number of time segments corresponding to the operation time of one or more unit(s) of electrical equipment over each time interval with the time segments in the first time interval corresponding to only one or a small number of time segments in the second time interval. The time grid is displayed preferably as a two dimensional graph in coordination with the display of power consumption from which an on-site analysis can be readily made of the production activity of one or more units of electrical equipment relative to power consumption. The x axis coordinate or abscissa defines the first or second time period of operation time for the selected one or more units of equipment within the facility and may correspond, for example, to one operating hour of machine time in any given day with of the time segments being equal which for this example represents sixty equal time segments. The y axis coordinate defines the other time period of operation for the same unit or units of equipment. The second time period is in a fixed time relationship to the first time period and may correspond, for example, to an entire day of machine operation, i.e., twenty four hours of operation. It should be understood that the time segments for the first and second time periods need not be limited to minutes and hours and can otherwise represent days along one coordinate and weeks or months of time along the other. In either case each of the time period are interrelated in a fixed relationship to one another with the time segments in the first time interval corresponding to only one or a small number of time segments in the second time interval.

The consumption of electricity of the one or more units of electrical equipment is measured over time in a conventional fashion preferably using e.g., a watt hour meter to measure power in kwh or in another conventional unit and displayed on the two coordinate time axis display preferably as a alphanumeric number or as a digital number. The measured consumption of electricity for said one or more unit(s) of electrical equipment is displayed at a location for each time segment in said first and second time interval at each intersection of the two time coordinates i.e., within the boxes formed at the intersection of each of the divided time periods along the x and y axes. An on-site determination of the operating condition of the one or more unit(s) of electrical equipment becomes visually apparent from the display.

The consumption of power can be alternatively displayed along with the display of the two different time coordinates in a three dimensional graph with the consumption of power displayed along a z axis (not shown). In this case the consumption of power can be displayed as a variable along the z axis e.g., with its height varying corresponding to the magnitude of measured power at the intersection of each of the divided time periods along the x and y axes. However this is less preferred since a three dimensional display would require more expensive plotting equipment to form the display particularly using different colors and would be somewhat more complicated.

The equipment used for recording consumed power of one or more units of electrical equipment is conventional and is not the subject of the present invention. Likewise conventional equipment may be used for graphically displaying time in a two coordinate time axis display with each of the two time coordinates interrelated to one another to form a time grid and for displaying the measured consumption of power at each of the intersecting coordinates. Since this equipment is commercially available it will not be further discussed and is not the subject of the present invention.

Nevertheless, a novel and preferred electronic information measurement and acquisition system for acquiring and storing data acquired from a substantial number of different units of electrical equipment in an arrangement using commercial grade watt hour meters for transmission to a host device such as general use PC as part of a monitoring operation and for analysis is taught by applicant in a corresponding patent application Ser. No. 11/062,250 filed on Feb. 18, 2005 the disclosure of which is herein incorporated by reference.

Figure 3:
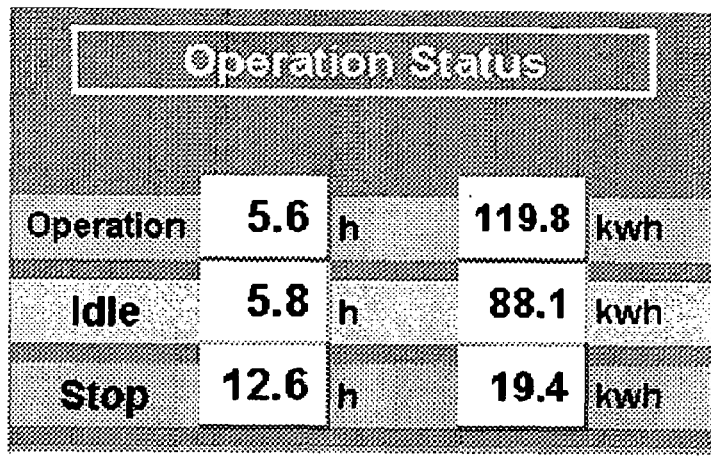
FIG. 3 is a visual indication of the different normal modes of operation status for the unit of electrical equipment of FIGS. 2A and 2B indicating the number of hours and power consumption for each mode of operation.
Figure 4:
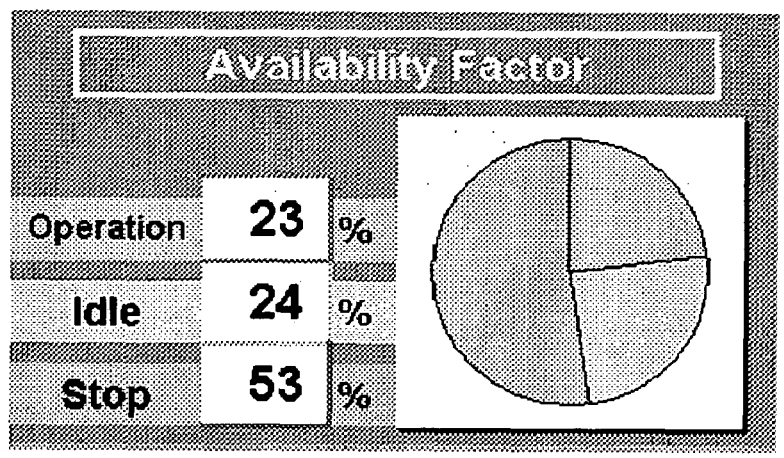
FIG. 4 is a visual indication of the operation rate in percent for each mode of operation shown in FIG. 3.

To increase the effectiveness of reading the display of FIG. 2 the operating status of each unit or units of electrical equipment may be established by storing in a database a threshold value for each unit or units of electrical equipment and making a comparison between the measured power consumption data and the threshold value. From the comparison a determination can readily be made for categorizing the mode of operation of the unit or units of electrical equipment as being either in a normal operating mode, a standby or idle state of operation or in a non-operating or "stopped" mode of operation. The stopped mode of operation is usually a state of minimal operation as opposed complete non-operation. This is displayed in FIG. 3 and provides an immediate indication of the total operating status of the equipment in each mode of operation.

Figure 5:
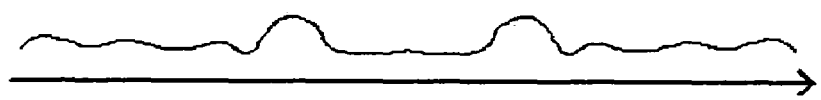
FIG. 5 is a further data display of the power consumption relative to time using the minor coordinate shown in FIGS. 2A and 2B for the time axis.

It is preferred to use different colors for each of the different modes of operation for FIGS. 2A and 2B. The use of color coordination in FIGS. 2A and 2B would visibly enhances reading of the operating status of one unit or more units of electrical equipment with each color visibly identifying a different operation status. However, it is not essential to the present invention to use different colors to achieve this effect. A similar effect can be achieved using different shades of gray or even different fonts (not shown). The operation rate as a percent of time within each operation status may also be displayed as is shown in FIG. 5.

The operating status of each unit or units of electrical equipment may alternatively be established by storing in a database data past statistics (historical data) of the operating status as well as the consumption of electricity of the one or more units of electrical equipment for each such operating mode and comparing the current measured data with the data in the database. The comparison can be made between current data and past data for the same apparatus in the same facility or between different facilities using similar equipment, i.e., different shops or stores which otherwise operate similarly. Moreover, the past data may be based on different operation cycles of one year, one month, one week etc.

From the display an on site analysis of the operating condition of the unit or units of electrical equipment can readily be made or is visually apparent. Moreover, the display provides for making an on site determination if power is being wasted by the unit or units. This may be self evident when the unit or units are idle over too long a time period or when the status should be in the "stop" mode of operation and not in idle which consumes more power etc. Also by making a comparison of one display in one time period against another it is self evident if power is being wasted.

What we claim is:

1. A method for permitting an on-site diagnosis of the performance and/or production activity of one or more units of electrical equipment in a facility by a shop, building, plant or factory to determine if power is being wasted comprising the steps of:
    measuring the consumption of electricity in said one or more unit(s) of electrical equipment in kwh or another conventional measuring unit;
    displaying time along two different coordinates corresponding to two separate axes which intersect one another for forming a time grid with the time displayed along one of the coordinates being interrelated to the time displayed along the other coordinate in a fixed relationship;
    dividing the time displayed along each coordinate into a multiple number of time segments corresponding to the operation time of said one or more unit(s) of electrical equipment over a first time interval for one of said coordinates and over a second time interval for the other coordinate with the time segments in the first time interval corresponding to only one or a small number of time segments in the second time interval; and
    displaying the measured consumption of electricity for said one or more unit(s) of electrical equipment at a location for each time segment in said first and second time interval at each intersection of the two time coordinates such that an on-site determination of the operating condition of said one or more unit(s) of electrical equipment becomes visually apparent from the display.

2. A method as defined in claim 1 wherein the measured consumption of electricity is displayed to identify each one of several different modes of operation of said one or more units of electrical equipment selected from the group consisting of a normal operating condition, an idle operating condition and an off or minimally on operating condition.

3. A method as defined in claim 2 wherein the measured consumption of electricity is displayed as a number.

4. A method as defined in claim 3 wherein each of said different modes of operation are determined based upon making a comparison of the measured consumption of electricity with a pre-determined threshold consumption of electricity.

5. A method as defined in claim 4 wherein each of the different modes of operation is displayed in a different color.

6. A method as defined in claim 3 wherein each of said different modes of operation are determined by storing historical data in a database of past statistics of the operating mode and the consumption of electricity of said one or more units of electrical equipment for each such operating mode and comparing the current measured data with the data in the database.

7. A method as defined in claim 6 wherein each of the different modes of operation is displayed in a different color.

8. A method as defined in claim 3 wherein each of the different modes of operation is displayed in a different color.

9. A method as defined in claim 3 wherein the number is a digital number.

10. A method as defined in claim 2 wherein the measured consumption of electricity is displayed as a contrasting color or shade of gray in direct relationship to the magnitude of the measured consumption.

11. A method as defined in claim 2 wherein the time segments along one coordinate correspond to the minutes in an hour and wherein the time segments along the other coordinate correspond to the hours in a day.

12. A method as defined in claim 11 further comprising displaying the operating hours and the electricity consumed in each different mode of operation.

13. A method as defined in claim 12 further comprising displaying the operation rate in percent for each different mode of operation.

14. A method as defined in claim 2 wherein each of the different modes of operation is displayed in different shades of gray.

* * * * *